(12) United States Patent
Grivna et al.

(10) Patent No.: US 7,638,385 B2
(45) Date of Patent: Dec. 29, 2009

(54) METHOD OF FORMING A SEMICONDUCTOR DEVICE AND STRUCTURE THEREFOR

(75) Inventors: Gordon M. Grivna, Mesa, AZ (US); Peter J. Zdebel, Austin, TX (US); Diann Dow, Austin, TX (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 606 days.

(21) Appl. No.: 11/119,106

(22) Filed: May 2, 2005

(65) Prior Publication Data

US 2006/0246652 A1    Nov. 2, 2006

(51) Int. Cl.
*H01L 21/8238* (2006.01)
*H01L 21/8249* (2006.01)

(52) U.S. Cl. ........... 438/208; 438/420; 257/544; 257/E29.019; 257/E21.544

(58) Field of Classification Search ........ 438/142, 438/149, 199, 67, 236, 238, 239, 241, 242, 438/243–248, 389, 208, 220, 356–358, 414, 438/420, 741, 912; 257/110, 279, 458, 461–464, 257/470, 490, 494–495, 509, 544, 656, 927, 257/929, E29.019, E21.544
See application file for complete search history.

(56) References Cited

U.S. PATENT DOCUMENTS

| | | | |
|---|---|---|---|
| 4,090,254 A | 5/1978 | Ho et al. | 365/150 |
| 4,313,255 A | 2/1982 | Shinozaki et al. | 29/576 |
| 4,574,469 A | 3/1986 | Mastroianni et al. | 29/576 |
| 4,663,831 A | 5/1987 | Birrittella et al. | 29/576 |
| 4,696,097 A | 9/1987 | McLaughlin et al. | 437/193 |
| 5,057,895 A | 10/1991 | Beasom | 357/49 |
| 5,177,576 A * | 1/1993 | Kimura et al. | 257/71 |
| 5,196,373 A | 3/1993 | Beasom | 437/203 |
| 5,283,461 A | 2/1994 | Beasom | 257/508 |
| 5,789,776 A | 8/1998 | Lancaster et al. | 257/296 |
| 6,025,225 A * | 2/2000 | Forbes et al. | 438/243 |
| 6,133,116 A | 10/2000 | Kim et al. | 438/430 |
| 6,326,253 B1 * | 12/2001 | Kotani | 438/202 |
| 6,686,634 B2 * | 2/2004 | Ishio | 257/394 |
| 6,943,413 B2 * | 9/2005 | Lee | 257/371 |
| 7,041,572 B2 * | 5/2006 | Yang et al. | 438/424 |
| 7,176,524 B2 * | 2/2007 | Loechelt et al. | 257/341 |
| 7,186,609 B2 * | 3/2007 | Korec et al. | 438/221 |
| 7,253,477 B2 * | 8/2007 | Loechelt et al. | 257/341 |
| 7,285,823 B2 * | 10/2007 | Loechelt et al. | 257/341 |
| 2001/0012655 A1 * | 8/2001 | Nordstom et al. | 438/239 |
| 2004/0018705 A1 | 1/2004 | Colson et al. | 438/570 |

(Continued)

OTHER PUBLICATIONS

"Characterization of Trench Isolation for BiCMOS Technologies", Klootwijk et al, Philips Research Laboratories Eindhoven, ICMTS, 0-7803-6275-6-3/00, copyright 2000 IEEE, pp. 00-200-00-204.
"Characteristics of a New Isolated p-Well Structure Using Thin Epitaxy Over the Buried Layer and Trench Isolation," Okazaki et al, IEEE Transactions on Electron Devices, vol. 39, No. 12, Dec. 1992, pp. 2758-2764.

*Primary Examiner*—W. David Coleman
*Assistant Examiner*—Maliheh Malek
(74) *Attorney, Agent, or Firm*—Robert F. Hightower

(57) ABSTRACT

A method of forming a semiconductor device includes forming isolation trenches that are used to isolate some of the electrical elements such as transistors, diodes, capacitors, or resistors on a semiconductor die from other elements on the semiconductor die.

27 Claims, 11 Drawing Sheets

U.S. PATENT DOCUMENTS

| | | | |
|---|---|---|---|
| 2004/0259318 A1* | 12/2004 | Williams et al. | 438/400 |
| 2005/0020003 A1* | 1/2005 | Johansson et al. | 438/207 |
| 2005/0173727 A1* | 8/2005 | Manna et al. | 257/173 |
| 2007/0034947 A1* | 2/2007 | Loechelt et al. | 257/341 |

* cited by examiner

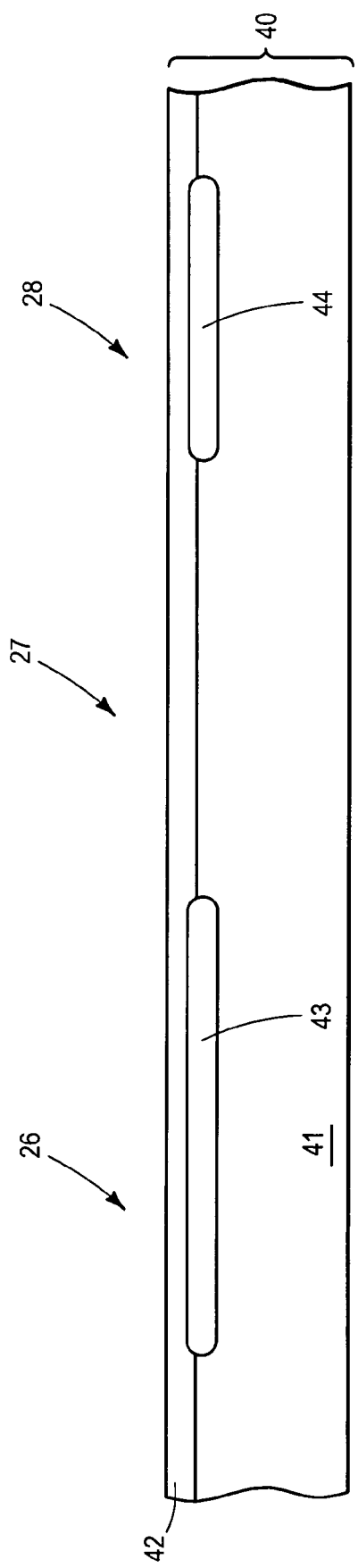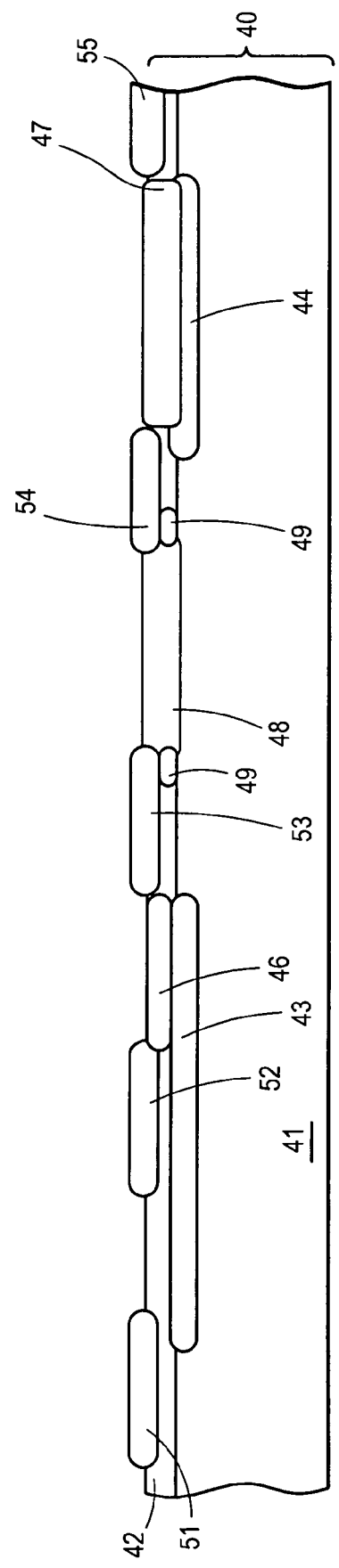

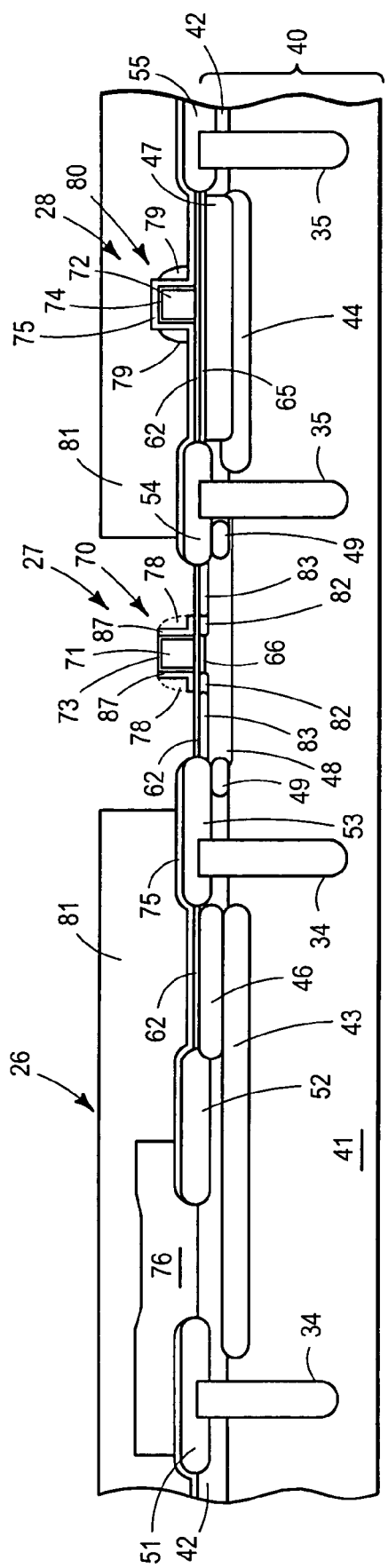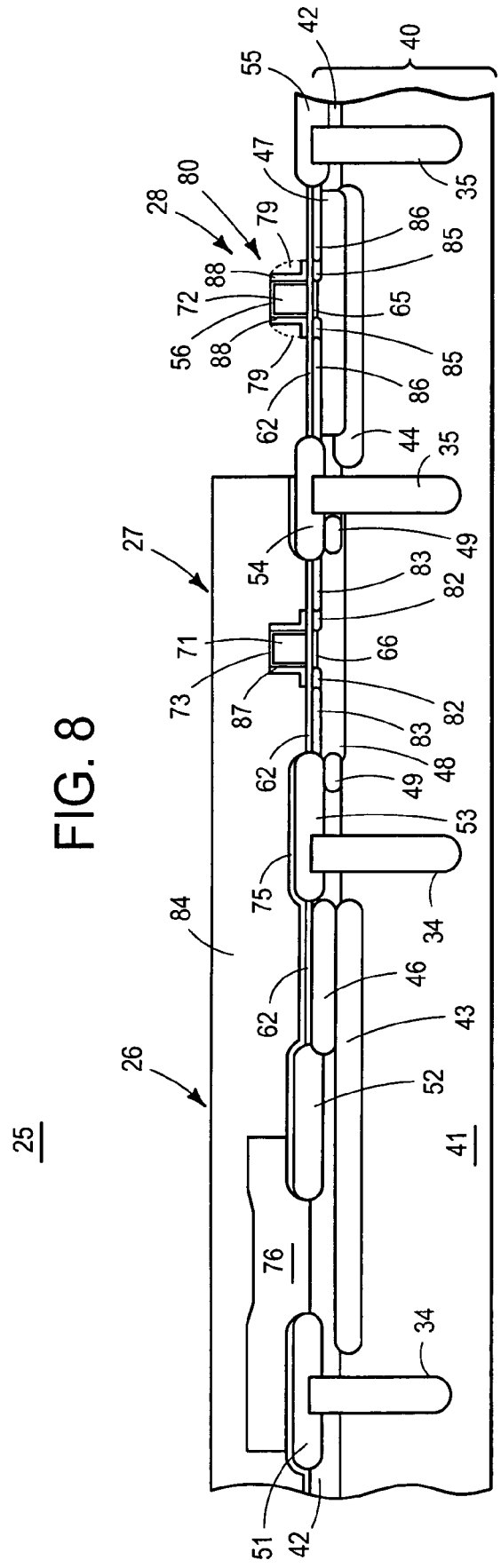

METHOD OF FORMING A SEMICONDUCTOR DEVICE AND STRUCTURE THEREFOR

BACKGROUND OF THE INVENTION

The present invention relates, in general, to electronics, and more particularly, to methods of forming semiconductor devices and structure.

In the past, the semiconductor industry utilized various semiconductor methods to produce complementary metal oxide semiconductor (MOS) transistors on a semiconductor die and to produce both MOS and bipolar transistors on the same semiconductor die. Isolation between two semiconductor devices generally was one of two types, junction isolation or dielectric isolation or a combination thereof. Junction isolation relied on transistor implementation such that there was always a reverse biased junction between devices which blocked unwanted current between devices. A second constraint to blocking unwanted current was that the depletion spread from one reverse biased junction could not reach any other junction's depletion region. A third constraint to blocking unwanted current was that the bipolar action of any parasitic PNP or NPN devices had to be small, in other words, immunity to latch-up was required. For example, two N-MOS devices could set in the same P-type well and be junction isolated from each other as long as the P-type well voltage was equal to or lower than the two N-type source regions and the two N-type drain regions, and the P-N junction depletion spread between two devices did not touch. A second example could have been that N-MOS and P-MOS devices were junction isolated from each other as long as the N-type well region of the P-MOS devices were at a higher voltage than the P-type well region of the N-MOS devices, and that current in the parasitic device made up of the N-MOS drain, N-MOS P-type well, and P-MOS N-type well was negligible. A third example was that bipolar devices generally needed a specific region added to ensure a reverse biased junction at all times to achieve junction isolation, that is, there needed to be another junction besides the emitter/base or base/collector junction. This junction could have been an emitter/isolation junction, base/isolation junction or a collector/isolation junction.

Implementation of junction isolated semiconductor devices was limited to thin field oxide layers with shallow diffused field implant regions for CMOS devices or deep diffused isolation areas, often called sinker regions. The shallow, typically less than one micron deep, diffused field implants did not provide adequate isolation and latch-up protection for the devices that included the MOS transistors. The sinker regions required a large mask opening for the diffusion source so that the diffusion did not become source limited. Also, the width of the doped region typically was about one hundred forty percent (140%) of the vertical diffusion. During operation, the width increased about another thirty percent so that the electrical width of the sinker region was about the same as the depth of the sinker region. Thus, the device spacings had to include extra space for the electrical depletion spread. These issues limited the integration density and scalability of the process that used the sinker regions. Additionally, since the MOS devices relied on shallow diffused field implant regions the design rules for the MOS devices had significant limitations in order to limit latch-up conditions. For example, the latch-up rules required large spacing between an N-channel source/drain diffusion and a P-channel source/drain diffusion. Thus, source and drain diffusions could not be on the edge of their respective wells. These rules were especially large for devices close to the input or output of the circuit. Such latch-up rules also limited scaling of the MOS devices and reduced integration density.

Oxide lined trench isolation was used in some bipolar applications. The oxide lined trenches provided low parasitics associated with the dielectric isolation and the smaller spacing rules. The oxide lined trenches did not significantly reduce cross-talk or ac carrier flow between the transistors. Additionally, the intrinsic bipolar device was not scalable so the use of oxide lined trenches did not result in size and cost reduction.

Accordingly, there is a need for semiconductor devices and processes therefor that provide improved latch-up protection, that provides improved isolation between transistors on a semiconductor die, that minimizes space utilization to provide high integration density.

BRIEF DESCRIPTION OF THE DRAWINGS

FIG. 2 illustrates an enlarged cross-sectional portion of the semiconductor device of FIG. 1 illustrating portions of an early stage of an embodiment of a method of forming the semiconductor device FIG. 1 in accordance with the present invention;

FIG. 3-FIG. 12 illustrate enlarged cross-sectional portions of the semiconductor device of FIG. 1 illustrating portions of subsequent stages according to an embodiment of a method of manufacturing the semiconductor device of FIG. 1 in accordance with the present invention.

For simplicity and clarity of illustration, elements in the figures are not necessarily to scale, and the same reference numbers in different figures denote the same elements. Additionally, descriptions and details of well-known steps and elements are omitted for simplicity of the description. Although the devices are explained herein as certain N-channel or P-Channel devices, a person of ordinary skill in the art will appreciate that complementary devices are also possible in accordance with the present invention. For clarity of the drawings, doped regions of device structures are illustrated as having generally straight-line edges and precise angular corners. However, those skilled in the art understand that due to the diffusion and activation of dopants the edges of doped regions are generally not straight lines and the corners are not precise angles.

DETAILED DESCRIPTION OF THE DRAWINGS

Figure 1:
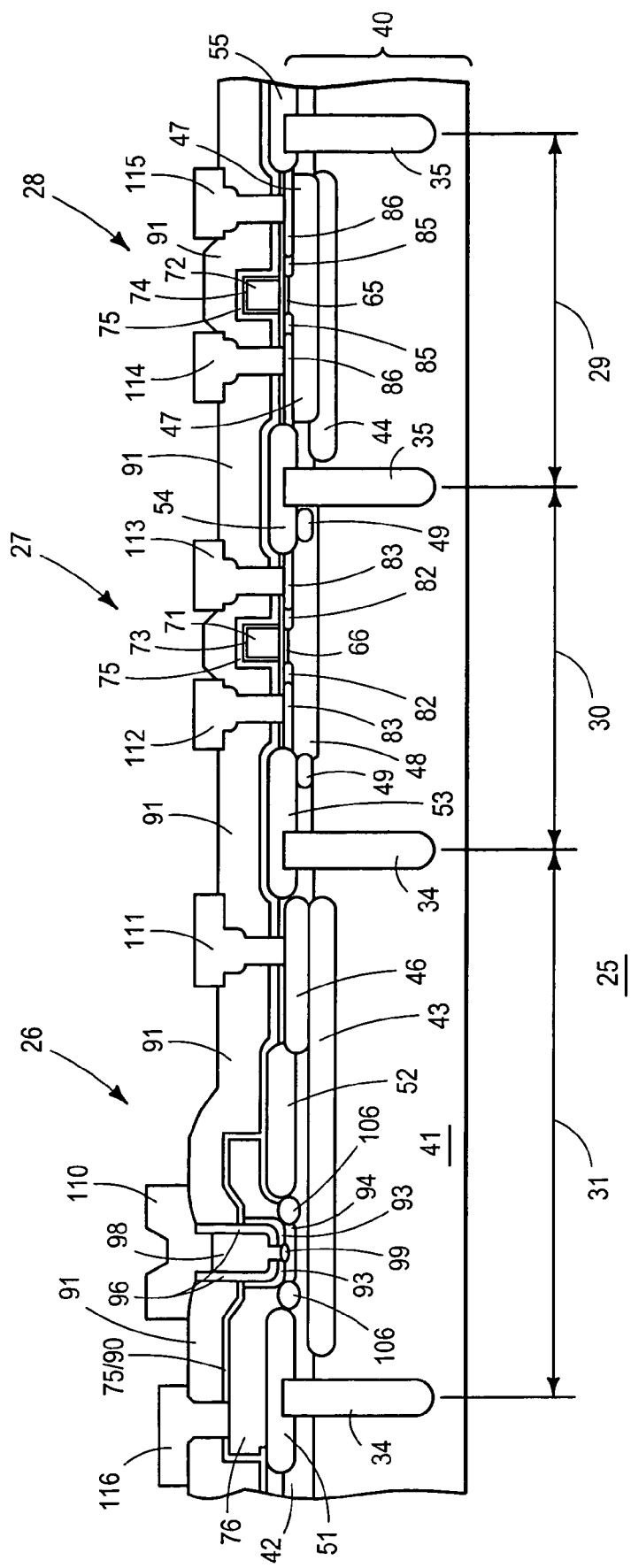
FIG. 1 illustrates an enlarged cross-sectional portion of an embodiment of a portion of a semiconductor device in accordance with the present invention.

FIG. 1 illustrates an enlarged cross-sectional view of an embodiment of a portion of a semiconductor device 25 that has improved latch-up immunity and electrical isolation between elements of device 25, that has high density, and that has improved latch-up protection. Device 25 includes a plurality of active electrical devices including transistors that are formed on a semiconductor substrate 40. Device 25 also includes a plurality of passive electrical devices as will be seen further hereinafter. Device 25 includes a bipolar transistor 26, a first MOS transistor 27, and a second MOS transistor 28 that are also formed on substrate 40. It will be understood by those skilled in the art that device 25 may have much larger numbers of any of transistors 26, 27, or 28, however, only three transistors are illustrated for clarity of the drawing. Additionally, transistors 26, 27, and 28 may be transistors of a digital circuit or an analog circuit of device 25. Device 25 may also include other active elements, such as other types of transistors and diodes, and passive elements, such as capacitors and resistors, that are not illustrated for clarity of the drawings.

Device 25 includes a first isolation trench 34 that is formed surrounding the periphery of a first portion of substrate 40 where transistor 26 is formed in order to isolate transistor 26 from transistors 27 and 28. Trench 34 typically extends into substrate 40 and also extends across substrate 40 along a direction substantially parallel to the surface of substrate 40 in order to surround the periphery of the first portion of substrate 40, thus, surrounding the periphery of transistor 26. Transistor 28 is formed in a second portion of substrate 40 that is surrounded by a second isolation trench 35. Trench 35 typically extends vertically into substrate 40 and also extends across substrate 40 along a direction substantially parallel to the surface of substrate 40 in order to surround the periphery of the second portion of substrate 40, thus, surrounding the periphery of transistor 28. As will be seen further hereinafter, trench 35 improves the latch-up protection for transistor 28. Transistor 27 generally is formed in a third portion of substrate 40 that is not within either the first or second portions of substrate 40 that are surrounded by respective isolation trenches 34 or 35. Transistor 27 typically is not surrounded by an isolation trench like trenches 34 and 35. Arrows 31, 29, and 30 identify in a general manner the respective first, second, and third portions of substrate 41. Device 25 and embodiments of methods to form device 25 are described hereinafter for an embodiment of device 25 where transistor 26 is an NPN bipolar transistor, transistor 27 is an N-channel MOS transistor, and transistor 28 is a P-channel MOS transistor. However, those skilled in the art will realize that semiconductor material conductivity types can be reversed to form complementary types of transistors.

FIG. 2 illustrates an enlarged cross-sectional portion of semiconductor device 25 illustrating portions of an early stage of an embodiment of a method of forming device 25. This description will have references to both FIG. 1 and FIG. 2. Device 25 is formed on a bulk semiconductor substrate 41 that typically is a P-type substrate having a peak doping concentration that is approximately intrinsic to 1E19 atoms/cm$^3$. The peak doping of substrate 41 could be higher if the doping of the buried layers is lighter. A first buried layer 43 generally is formed on the surface of substrate 41 within the first portion of substrate 41 where transistor 26 is formed, and a second buried layer 44 may be formed on the surface of substrate 41 in the second portion of substrate 41 where transistor 28 is formed. Buried layers 43 and 44 typically are N-type regions that are formed on the surface of substrate 41 by ion implantation or other similar techniques that are well known to those skilled in the art. After positioning the dopants used to form layers 43 and 44 within substrate 41, substrate 41 is annealed to activate the dopants. Thereafter, an epitaxial layer 42 generally is formed on the surface of substrate 41 and overlying buried layers 43 and 44. Layer 42 typically is an N-type layer that has a peak doping concentration less than about 1E19 atoms/cm$^3$.

FIG. 3 illustrates an enlarged cross-sectional view of a portion of device 25 at a subsequent stage of an embodiment of a method of forming semiconductor device 25. After forming layer 42, a mask may be applied to expose a portion of layer 42 that is overlying a portion of layer 43. The exposed portion of layer 42 is doped to form a collector contact region 46 of transistor 26 within layer 42 and abutting layer 43. Region 46 typically is doped as N-type with a higher peak doping concentration than layer 42. Subsequently, the mask is removed and another mask is applied to expose a portion of the third portion of substrate 41 where transistor 27 is formed. The exposed portion of the third portion of substrate 40 is doped to form a P-type region 48. Subsequently, the mask is removed and a third mask is applied exposing a portion of layer 42 overlying layer 44 within the second portion of substrate 40. The exposed portion of substrate 40 is doped to form an N-type region 47 within layer 42 and abutting layer 44. After forming region 47, the third mask is removed and a fourth mask is applied to expose a portion of substrate 40 overlying the outer or distal ends of region 48. Field threshold adjustment regions 49 are formed through the fourth mask so that regions 49 are formed within layer 42 and abutting both substrate 41 and the outer or distal ends of region 48. The fourth mask is removed and a fifth mask is applied that exposes the surface of substrate 40 where field oxide regions are to be formed, such as between contact region 46 and other portions of transistor 26 and around the outside edges of transistors 26, 27, and 28. The exposed portions of substrate 40 are oxidized to form field oxide regions or field oxides 51, 52, 53, 54, and 55. Field oxides 51, 52, 53, 54, and 55 generally are formed by LOCOS or poly-buffer LOCOS techniques or shallow trench isolation or other similar techniques that are well known to those skilled in the art. The fifth mask is subsequently removed to facilitate subsequent operations.

Figure 4:
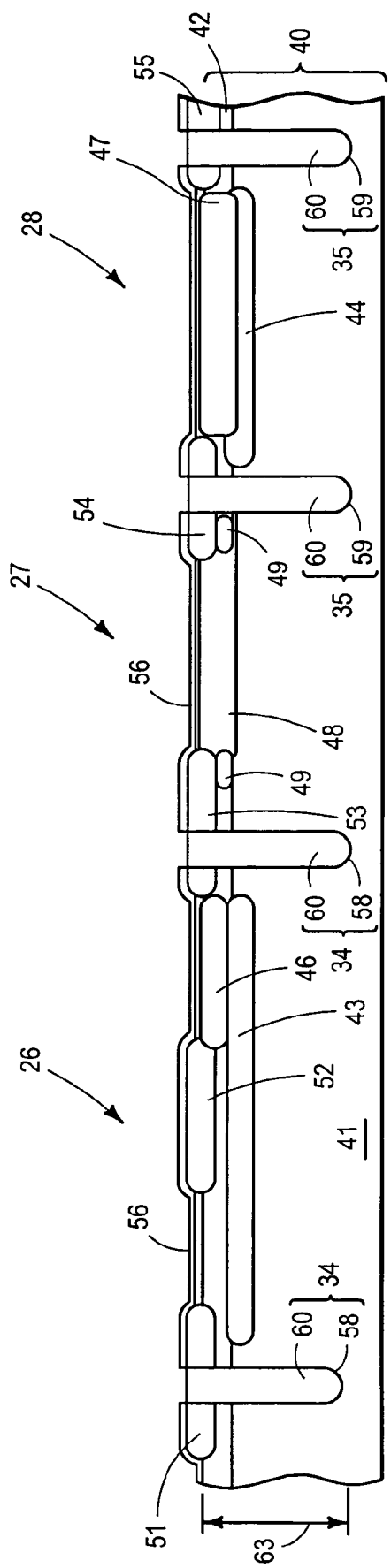

FIG. 4 illustrates an enlarged cross-sectional view of a portion of device 25 at a subsequent stage of an embodiment of a method of forming device 25. A mask layer 56 may be formed on substrate 40 to facilitate forming openings for isolation trenches 34 and 35. Mask layer 56 typically is a layer of silicon nitride or a layer of silicon nitride covered by a layer of oxide. A first opening can be formed through mask layer 56 above field oxides 51 and 53 and extending around the periphery of the first portion of substrate 40 where transistor 26 is being formed, and a second opening can be formed through layer 56 above field oxides 54 and 55 and extending around the periphery of the second portion of substrate 40 where transistor 27 is being formed. Using the first opening in layer 56, an opening 58 may be formed to extend through field oxides 51 and 53, through epitaxial layer 42, and extending a first distance 63 into of substrate 40. At the same time the second opening of layer 56 is used to facilitate forming an opening 59 through field oxides 54 and 55, through epitaxial layer 42, and extending first distance 63 into substrate 40. Openings 58 and 59 are formed using trench formation methods that are well known to those skilled in the art. Typically, openings 58 and 59 have a width 64 that is very small. Width 64 generally ranges between a minimum that is substantially the minimum resolution of the photolithography equipment used to form device 25 up to a size that is no greater than the width of field oxides 51-55. In most embodiments, width 64 is no greater than, and typically is much less than, about eighty percent (80%) of the value of distance 63 so that trenches 34 and 35 occupy very little area and minimally impact the packing density of device 25. As will be seen further hereinafter, distance 63 is formed to ensure that openings 58 and 59 extend to at least touch substrate 41 and typically extend about one to eight microns into substrate 40. Openings 58 and 59 are filled with a highly doped semiconductor material 60 that has a doping type that is opposite to the doping type of layer 42 in order to form a P-N junction between layer 42 and trenches 34 and 35. The doping concentration of doped semiconductor material 60 is greater than the doping concentration of adjacent material, such as adjacent portions of layer 42, and the doping concentration is formed to be substantially constant through out material 60. The value of the substantially constant doping typically ranges from about 1E18 to 1E21 atoms/cm$^3$ and preferably is doped to the saturation of the material used for material 60. The goal is to form material 60 so that the selected doping concentration is formed to be substantially constant within material 60. However, as is well known in the art there are always minor variances that prevent the doping from being identically constant. It is well established in the art that variances of up to about ten percent (10%) are regarded as reasonable variances from the ideal goal of exactly constant. Additionally it is well known that the doping concentration may vary along the outer edge along the interface of material 60 with substrate 41 and layer 42 due to out diffusion and other well-known factors. Typically, material 60 is doped polysilicon but may be other conductive materials such as epitaxial silicon or conductive polymers. Forming the P-N junction abutting region 48 improves latch-up immunity as will be seen further hereinafter. The high doping of material 60 assists in providing the P-N junction formed at the interface of material 60 and layer 42 with a large potential well in order to prevent carriers from flowing between transistor 26 and other active and passive elements on device 25 and to prevent carriers from flowing from transistor 27 through substrate 40 to other active and passive elements on device 25. Portions of material 60 extending out past the upper surface of field oxides 51, 53, 54, and 55 may be removed, typically by etching, so that material 60 can be substantially coplanar with the top surface of the material in which trenches 34 and 35 are formed, such as coplanar with the top surface of field oxides 51, 53, 54, and 55. Techniques for filling trenches having openings as small as about 0.1 microns are well known in the art.

Figure 5:
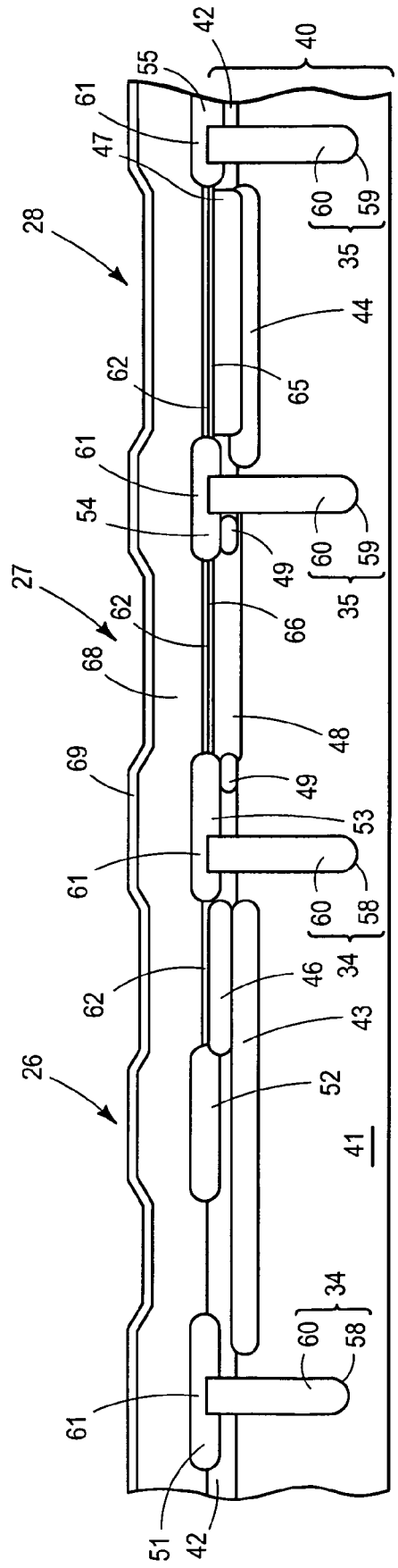

FIG. 5 illustrates an enlarged cross-sectional view of a portion of device 25 at another subsequent stage of an embodiment of a method of forming device 25. An insulator 61 is formed covering material 60 in order to electrically isolate trenches 34 and 35 from materials that will subsequently be formed on top of field oxides 51, 53, 54, and 55. In the preferred embodiment a portion of material 60 is oxidized to form insulator 61. Mask layer 56 is later removed. The surface of substrate 40 may have an oxide layer under mask layer 56. In such a case, the oxide layer is typically removed. Channel region threshold adjusts are formed for transistors 27 and 28. A threshold adjust 65 for the channel region of transistor 27 is formed on the surface of region 47. In order to form adjust 65, a mask typically is applied onto substrate 40 having an opening that exposes at least a portion of region 47 between field oxides 54 and 55. An N-type dopant is subsequently formed extending into region 47 through the opening in the mask. The doping concentration of adjust 65 typically is selected to provide proper operation of the device. The mask is removed and another mask is applied that exposes at least a portion of region 48 between field oxides 53 and 54. A P-type dopant is formed extending into region 48 through the opening in the mask in order to form a threshold adjust 66 for transistor 28. The mask is removed to expose the surface of substrate 40 and a gate insulator mask is applied that exposes at least a portion of the surface of substrate 40 overlying regions 47 and 48. A gate insulator 62 for transistors 27 and 28 is formed on the exposed surface of substrate 40. Insulator 62 may also be formed overlying region 46. Afterwards, a gate material layer 68 is applied onto substrate 40 and a protective layer 69 is applied onto gate material layer 68. In the preferred embodiment, the material of layer 68 is polysilicon and protective layer 69 is silicon dioxide. Once gate material layer 68 is formed, subsequent operations are performed at time and temperatures combinations that are no greater than about nine hundred degrees Celsius (900° C.) for approximately thirty (30) minutes or the equivalent of one thousand twenty-five degrees Celsius (1025° C.) for approximately thirty (30) seconds in order to not disturb dopants that are previously positioned within substrate 40, such as the dopants of layers 43 and 44, regions 46, 47, 48, and 49 and the dopants of trenches 34 and 35, as will be seen further hereinafter.

Figure 6:
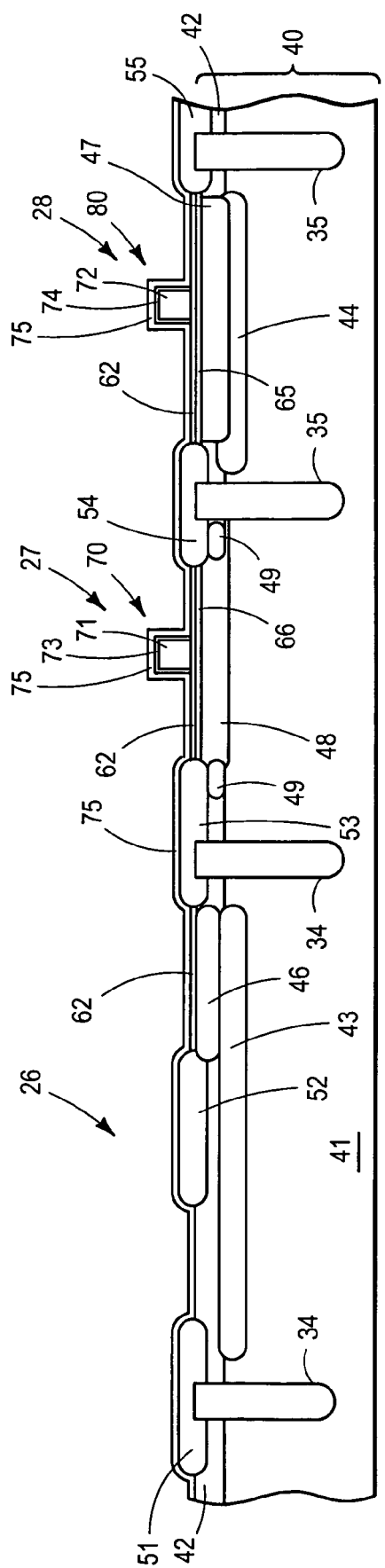

FIG. 6 illustrates an enlarged cross-sectional view of an embodiment of a portion of device 25 at a further stage of an embodiment of a method of forming device 25. Gate material layer 68 and protective layer 69 are patterned to remove layers 68 and 69 except for portions 71 and 72 of layer 68 overlying regions 48 and 47 where gates for transistors 27 and 28 are desired. Typically the gates, thus portions 71 and 72, are substantially centered to regions 47 and 48 but may be offset from center in some embodiments such as where higher breakdown voltage is desired. Insulators 73 and 74 are formed on the sidewalls and top surface of portions 71 and 72, respectively, in order to form a protective layer to facilitate subsequent steps in the method of forming device 25. In the preferred embodiment, insulators 73 and 74 are formed by oxidizing the sidewalls and top surface of respective portions 71 and 72. Thereafter, a silicon nitride layer 75 is formed covering the surface of substrate 40 including covering gate portions 71 and 72 and insulators 73 and 74. Portions 71 and 72 along with respective insulators 73 and 74 and the portion of layer 75 covering insulators 73 and 74 form respective gate structures 70 and 80 for respective transistors 27 and 28. Additionally, portions of layer 68 may be left elsewhere on the surface of substrate 40 in order to form resistors (not shown) on the surface of substrate 40. Such resistors may also be covered by layer 75 to protect the resistors during subsequent steps in the method of forming device 25. The steps explained in the description of FIG. 6 are performed at temperatures that are no greater than about eight hundred degrees Celsius (800° C.) to provide the hereinbefore described temperature advantages.

Figure 7:
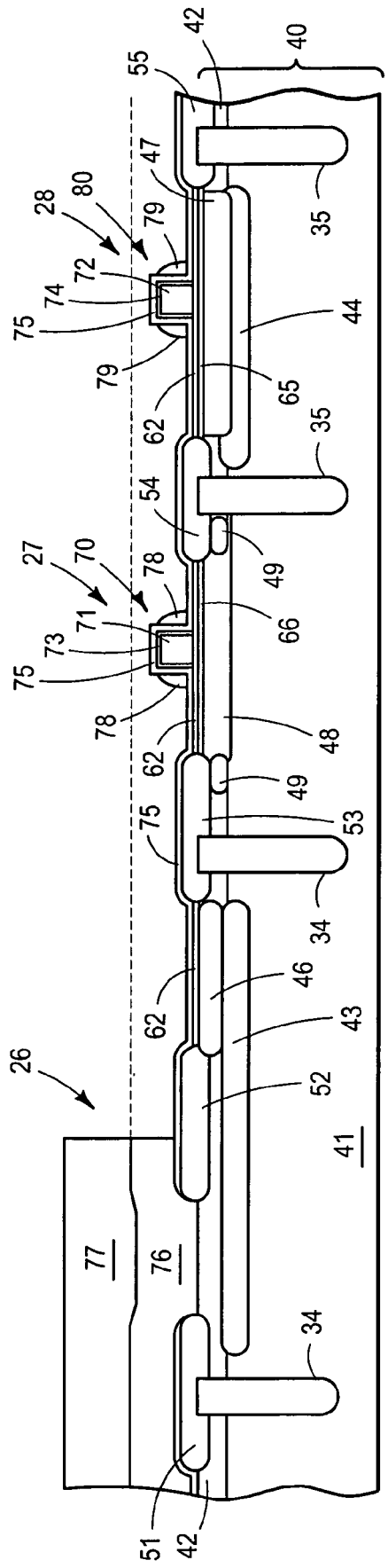

FIG. 7 illustrates an enlarged cross-sectional view of a portion of device 25 at a further stage of an embodiment of a method of forming device 25. A region of the first portion of substrate 40 is prepared for forming bipolar transistor 26. Layer 75 is removed from the portion of substrate 40 where the active portion of transistor 26 is being formed. In the preferred embodiment, layer 75 is removed from the portion of substrate 40 overlying layer 43 and between field oxides 51 and 52. A polysilicon layer 76 is applied across the first, second, and third portions of substrate 40 as illustrated by a dashed line. A mask 77 is applied to protect the portion of layer 76 between field oxides 51 and 52 and a portion that extend laterally across substrate 40 to a point where an external connection is to be formed to layer 76. In the preferred embodiment, an anisotropic etch is utilized to remove the unprotected portions of layer 76 leaving a first portion of layer 76 contacting layer 42 overlying layer 43 and leaving spacers 78 surrounding gate structure 70 and spacers 79 surrounding gate structure 80. Those skilled in the art will realize that portions of layer 76 also may be left on the surface of layer 75 and used to form resistors or capacitors. Such portions of layer 76 typically are doped to control the resistance value. The steps explained in the description of FIG. 7 are performed at temperatures that are no greater than about eight hundred degrees Celsius (800° C.) to provide the hereinbefore described temperature advantages.

FIG. 8 illustrates an enlarged cross-sectional view of a portion of device 25 at another subsequent stage according to an embodiment of a method of forming device 25 including forming lightly doped source and drain regions for transistor 27. Mask 77 of FIG. 7 is removed and a mask 81 is applied that exposes substrate 40 over at least a portion of region 48. Source and drain regions 83 are formed through insulator 62 to extend from the surface of substrate 40 into adjust 66. Spacers 78 protect a portion of region 48 and adjust 66 near the edges of gate structure 70 to prevent forming dopants in this region. Spacers 78 are removed and the exposed portions of transistor 27 are once again doped through insulator 62 in order to form lightly doped source and drain region 82. Spacers 78 are illustrated by dashed lines in FIG. 8 because spacers 78 are removed during the steps explained in the description of FIG. 8. In the preferred embodiment, spacers 78 are removed with an isotropic etch that also removes horizontal portions of layer 75 including the portions on top of structure 70 and on the surface of substrate 40 outside of spacers 78. However, portions of layer 75 on the side of structure 70 and on the surface of insulator 62 underlying spacers 78 usually remain as an insulator 87. Mask 81 is later removed. The steps explained in the description of FIG. 8 are performed at temperatures that are no greater than about eight hundred degrees Celsius (800° C.) to provide the hereinbefore described temperature advantages.

FIG. 9 illustrates an enlarged cross-sectional view of a portion of device 25 at another subsequent stage according to an embodiment of a method of forming device 25 including forming lightly doped source and drain regions of transistor 28. A mask 84 is applied exposing substrate 40 over at least a portion of region 47. Source and drain regions 86 are formed through insulator 62 and layer 75 while spacers 79 protect a portion of region 47 under spacers 79 and gate structure 80. Spacers 79 are removed and the exposed portions of transistor 28 are once again doped through insulator 62 and layer 75 in order to form lightly doped source and drain regions 85. Spacers 79 are illustrated by dashed lines in FIG. 9 because spacers 79 are removed during the steps explained in the description of FIG. 9. In the preferred embodiment, spacers 79 are removed with an isotropic etch that also removes horizontal portions of layer 75 including the portions on the top of structure 80 and on the surface of substrate 40 outside of spacers 79. However, portions of layer 75 on the sidewalls of structure 80 and on the surface of insulator 62 underlying spacers 79 usually remain as an insulator 88. Mask 84 is removed. Regions 82, 83, 85, and 86 typically are formed by ion implantation techniques that are well know to those skilled in the art but may be formed by other doping techniques. The steps explained in the description of FIG. 9 are performed at temperatures that are no greater than about eight hundred degrees Celsius (800° C.) to provide the hereinbefore described temperature advantages.

Figure 10:
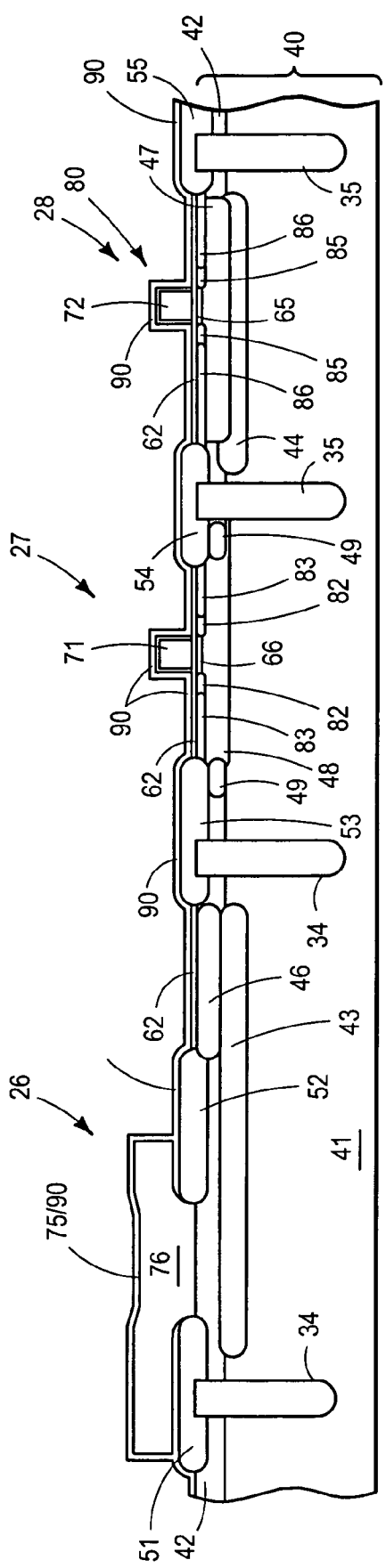

FIG. 10 illustrates an enlarged cross-sectional view of a portion of device 25 at another subsequent stage of an embodiment of a method of forming device 25. After mask 84 is removed, nitride layer 75 remains in the first portion of substrate 40 where bipolar transistor 26 is being formed. However, layer 75 has been removed from the second and third portions of substrate 40 where transistors 27 and 28 are being formed. Another protective layer 90 is applied to cover the portions of substrate 40 where transistors 26, 27, and 28 are being formed in order to encapsulate transistors 26, 27, and 28 and protect portions of transistors 26, 27, and 28 from subsequent operations. These portions of layer 75 are identified in FIG. 10 as a layer 75/90. The material of layer 90 typically is the same as the material of layer 75. The steps explained in the description of FIG. 10 are performed at temperatures that are no greater than about eight hundred degrees Celsius (800° C.) to provide the hereinbefore described temperature advantages.

Figure 11:
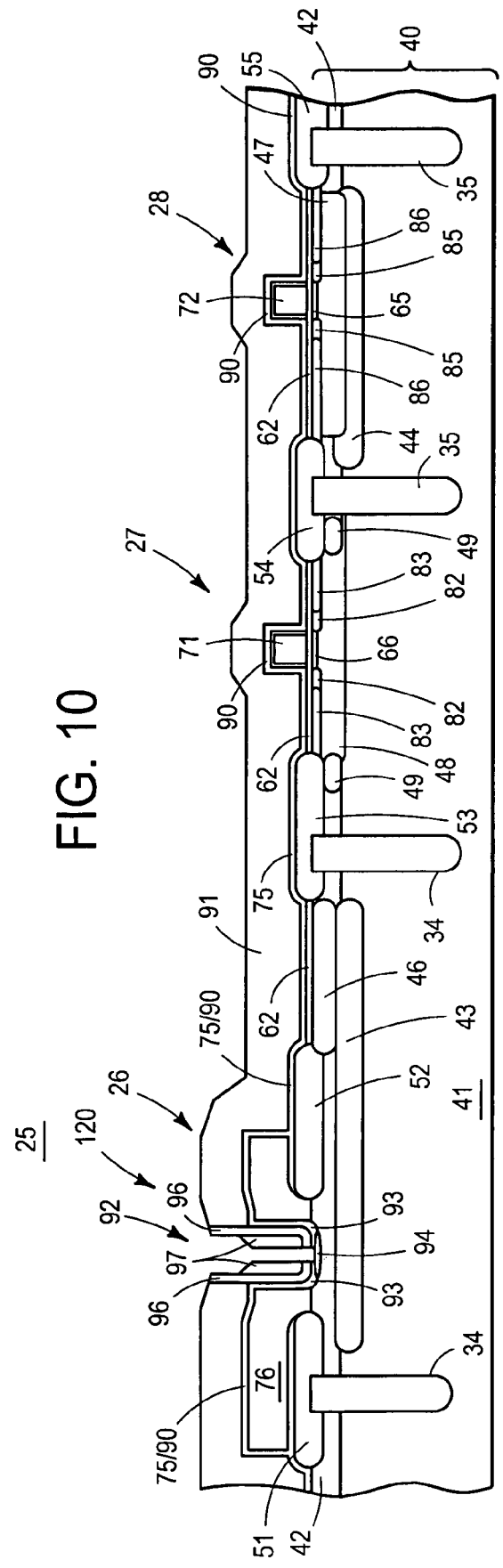

FIG. 11 illustrates an enlarged cross-sectional view of a portion of device 25 at a later stage according to an embodiment of a method of forming device 25. A region of the first portion of substrate 40 is used for forming bipolar transistor 26 including forming an active structure 120 of transistor 26. Active structure 120 is identified in a general manner by an arrow. An inter-layer dielectric layer 91 is formed on substrate 40. An opening 92 is formed through layer 91i layer 90, and layer 76, typically by an oxidation process, to expose a portion of the surface of substrate 40 overlying layer 43 and between field oxides 51 and 52. A portion of the exposed surface of substrate 40 is doped through opening 92 to form a base region 94 of transistor 26. An insulator 93 is formed along the sidewalls of opening 92 and across the exposed surface of substrate 40 overlying region 94. In the preferred embodiment, insulator 93 is formed by a oxidizing the exposed sidewalls of layer 76 and the expose surface of substrate 40. In this preferred embodiment, the oxidation is performed at temperatures below approximately eight hundred degrees Celsius to prevent disturbing dopants within transistors 26, 27, and 28. Next, the active base region of transistor 26 is formed. A silicon nitride layer 96 is formed covering insulator 93. A spacer, typically polysilicon, is formed inside opening 92 exposing a portion of layer 96. A second opening is formed through material 97, layer 96, and insulator 93 to expose a portion of region 94. Typically, an anisotropic etch is used to form the second opening. The width of the second opening is much less than the width of opening 92. The steps explained in the description of FIG. 11 are performed at temperatures that are no greater than about eight hundred degrees Celsius (800° C.) to provide the hereinbefore described temperature advantages.

Figure 12:
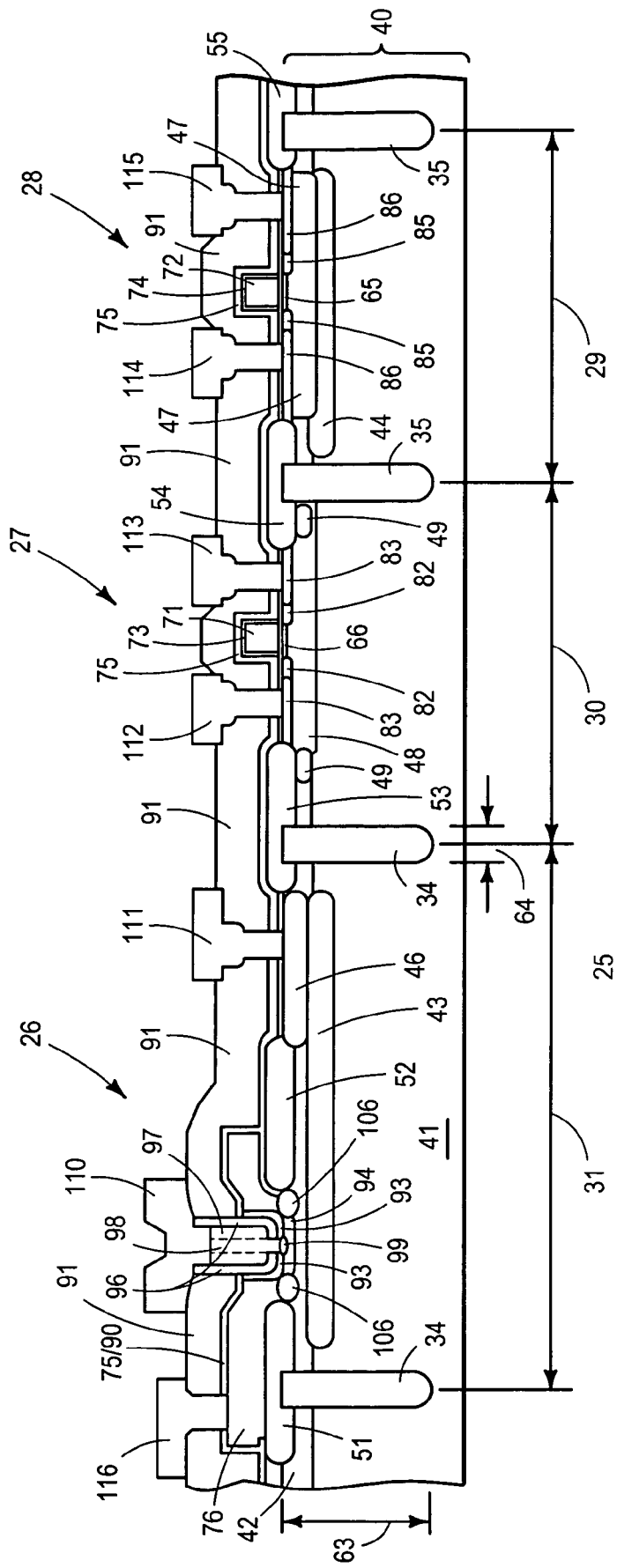

FIG. 12 illustrates an enlarged cross-sectional view of a portion of device 25 at another subsequent stage in an embodiment of a method of forming device 25. The second opening is filled with a doped semiconductor material 98 such as doped polysilicon. Substrate 40 is subsequently heated to activate the dopants in the doped regions of transistors 26, 27, and 28. In the preferred embodiment a rapid thermal anneal is utilized to activate the dopants in both bipolar transistor 26 and MOS transistors 27 and 28. Using one high temperature step to activate the dopants in both bipolar and MOS transistors provides greater control of the active areas of the transistors and improves the performance of the transistors. Dopants from material 98 dope a portion of region 94 to form an emitter region 99 of transistor 26.

It should be noted that if transistor 26 is not formed as a part of device 25, the steps between forming layer 75/90 and forming layer 91 are skipped, and the one-time anneal to activate dopants may be performed just after forming layer 91. Layer 91 and layer 90 are patterned to expose regions of transistors where conductors are to make electrical contact to portions of transistors 26, 27, and 28. Conductor material is formed within the openings and extending out of the openings to facilitate forming electrical contact to transistors 26, 27, and 27. The openings include an opening to facilitate forming a base electrode 116 electrically contacting the first portion of layer 76, to facilitate forming an emitter electrode 110 electrically contacting region 99, to facilitate forming a collector electrode 111 electrically contacting collector contact region 46, to facilitate forming source and drain electrodes 112 and 113 electrically contacting source and drain regions 83 of transistor 27, and to facilitate forming source and drain electrodes 114 and 115 electrically contacting source and drain regions 86 of transistor 28. A conductor material such as titanium, tungsten, or aluminum is formed within the openings and contacting the described portions of transistors 26, 27, and 28.

Figure 13:
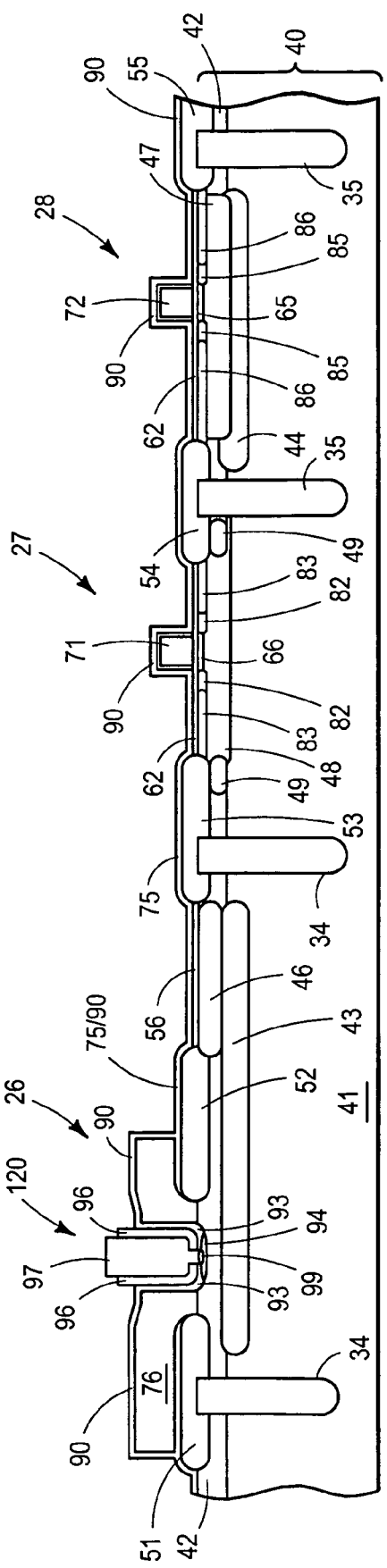
FIG. 13-FIG. 17 illustrate enlarged cross-sectional portions of the semiconductor device of FIG. 1 illustrating portions of stages of an alternate embodiment of a method of forming the semiconductor device FIG. 1 in accordance with the present invention.
Figure 14:
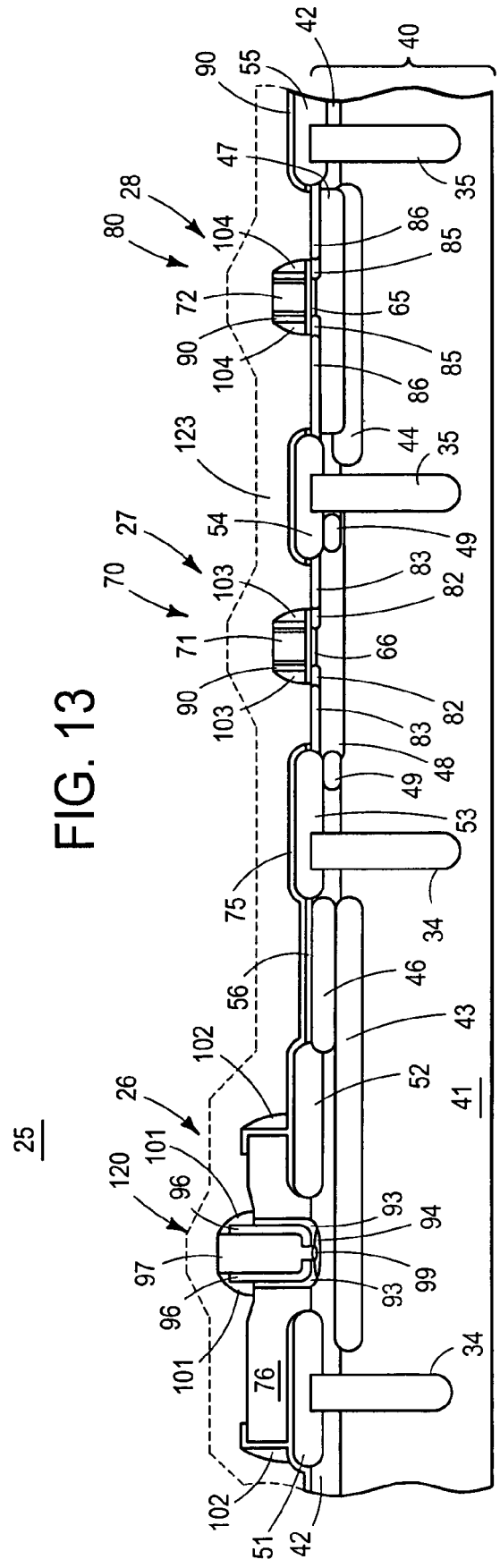
Figure 15:
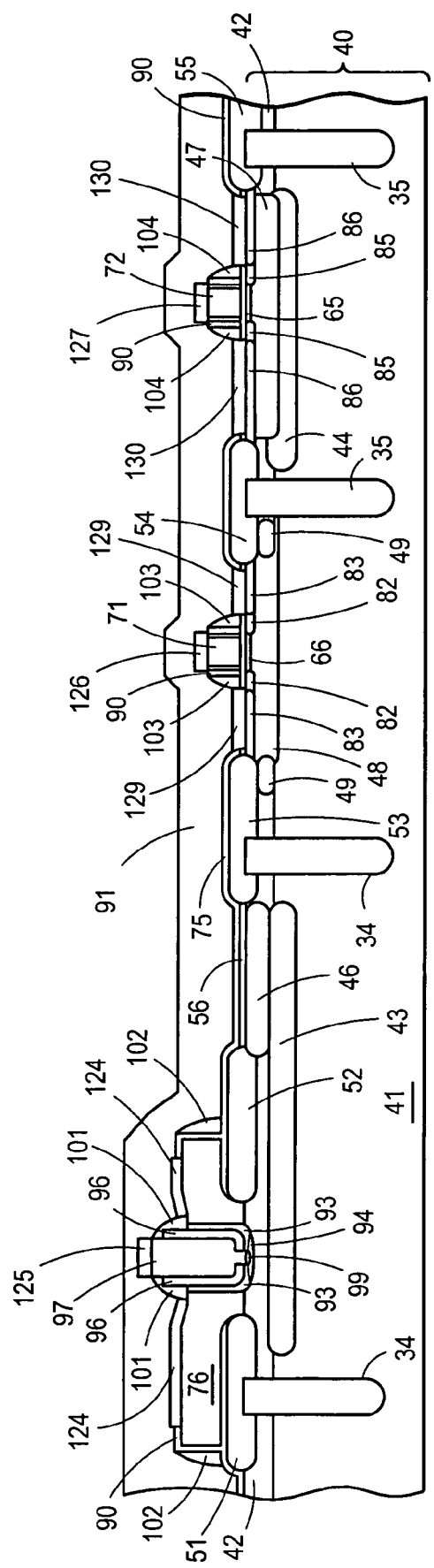

FIG. 13 through FIG. 15 illustrate enlarged cross-sectional views of a portion of device 25 at various stages according to an alternate embodiment of a method of forming device 25.

FIG. 13 illustrates an enlarged cross-sectional view of a portion of device 25 according to an alternate embodiment of a method of forming portions of transistors 26, 27, and 28. Referring back to FIG. 11, material 97 is formed within the opening through layer 76 in structure 120 of transistor 26. Referring again to FIG. 13, layer 91 of FIG. 11 is removed after material 97 is formed within the opening within structure 120 of transistor 26. After layer 91 is removed, portions of layer 96 and material 97 extend out past protective layer 90.

FIG. 14 illustrates an enlarged cross-sectional view of a portion of device 25 at a manufacturing stage subsequent to the stage illustrated in FIG. 13. An insulator layer 123, illustrated by a dashed line, is applied covering transistors 26, 27, and 28. Spacers are formed around at least the portions of the areas where the electrodes are to be formed. Typically, an anisotropic etch is utilized to remove portions of insulator layer 123 while leaving other portions of insulator layer 123 as spacers 101 around the expose portions of active structure 120, spacers 102 around the sides of layer 76, spacers 103 along the sidewalls of gate structure 70, and spacers 104 along the sidewalls of gate structure 80. A mask (not shown) may be applied to expose areas where it is desired to form complex low resistance electrode structures such as titanium silicide, platinum silicide, or similar electrodes. For example, it may be desirable to form such structures contacting material 97 of structure 120 and gate structures 70 and 80. The mask exposes structure 120 and portions of layer 76 surrounding structure 120, gate structure 70 and portions of layer 90 surroundings structure 70, and structure 80 along with portions of layer 90 surrounding structure 80. The exposed portions of layer 90 are removed from the horizontal surfaces. For example, an anisotropic etch is used to remove the horizontal portions and leave the non-horizontal portions of layer 90.

FIG. 15 illustrates an enlarged cross-sectional view of a portion of device 25 at a subsequent stage according to an alternate embodiment of a method of forming portions of transistors 26, 27, and 28. Electrode material is formed to contact the desired connection points. Electrode material is formed on portions 71, 72, regions 83 and 86, layer 76, and material 97 to form respective electrodes 126, 127, 129, 130, 124, and 125.

Figure 16:
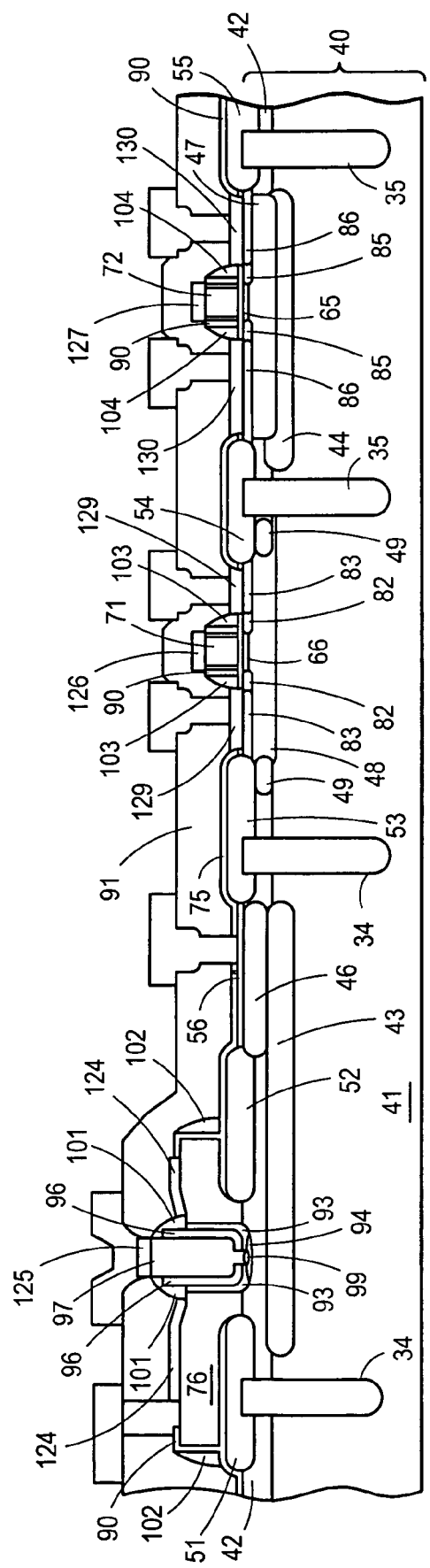

Referring to FIG. 16, inter-layer dielectric layer 91 is applied onto substrate 40, and electrodes are formed as described hereinbefore in the description of FIG. 12.

In view of all of the above, it is evident that a novel device and method is disclosed. Isolation trenches 34 and 35 improve the latch-up protection of device 25. For example, in the preferred embodiment region 83 is N-type, region 48 is P-type, and region 49 is N-type. Without trench 35 abutting region 48, regions 83, 48, and 49 form a parasitic NPN transistor. Without trench 35, the integrated doping concentration of the base, region 48, is low and the integrated concentration of the emitter, region 83, is high which results in a high beta for the parasitic NPN transistor. Since the doping concentration of trench 35 generally is high, the integrated doping concentration of the base is increased thereby reducing the beta. Typically, the beta is about one, thereby improving the latch-up immunity by a factor of at least two. As will be seen by examples that follow, trench 35 improves the latch-up immunity of transistors in the interior of device 25 without changing the density of device 25, and improves the latch-up immunity of I/O cells while also increasing the density of device 25. Additionally, the small size of trenches such as trench 35 allows them to be used in applications where junction isolation could not previously be used such as for channel stops. For the case when transistors 27 and 28 are in an input/output (I/O) cell, trench 35 also reduces the size or surface area required to form transistors 27 and 28. Without trench 35, the spacing between region 83 and region 86 must be large to reduce latch-up. However, abutting trench 35 to region 48 allows region 83 to be in close proximity to region 86. For example, for an exemplary active or passive element that is formed close to an input type device, or an output type device, or other high noise source that can trigger latch-up and the exemplary element is formed without trench 35 and formed with 0.36 micron design rules, regions that would be similar to regions 83 and 86 must be separated by greater than twenty microns. However, with trench 35 regions 83 and 86 can be as close as about three to four microns. For the case of a similar exemplary device without trench 35 and formed with 0.25 micron design rules, the distance between regions that are similar to regions 83 and 86 has to be about twenty microns. However, with trench 35 regions 83 and 86 for 0.25 micron design rules can be as close as one to two microns.

The high doping concentration of trenches 34 and 35 also provides low resistance substrate contacts for device 25. Extending trenches 34 and 35 to at least touch substrate 41 and form electrical contact thereto facilitates forming a low resistance contact. Typically, distance 63 is sufficient for trenches 34 and 35 to extend further into substrate 41 than either of layer 42 or region 48. Typically, trenches 34 and 35 extend between one and eight microns past layer 42 into substrate 41 in order to provide a very low resistance substrate contact. Width 64 may be as small as between 0.8 and 1.5 microns. The low resistance substrate contact formed by trenches 34 and 35 reduces the number of body contacts that must be formed on the surface of device 25. Without trenches 34 and 35, body contacts typically have to be formed about every fifty microns, but with trenches 34 and 35 the distance is increased to about three hundred microns, thereby further increasing the integration density of device 25. When substrate 41 is highly doped, trenches 34 and 35 merely need to touch substrate 41 and form electrical contact thereto.

Figure 17:
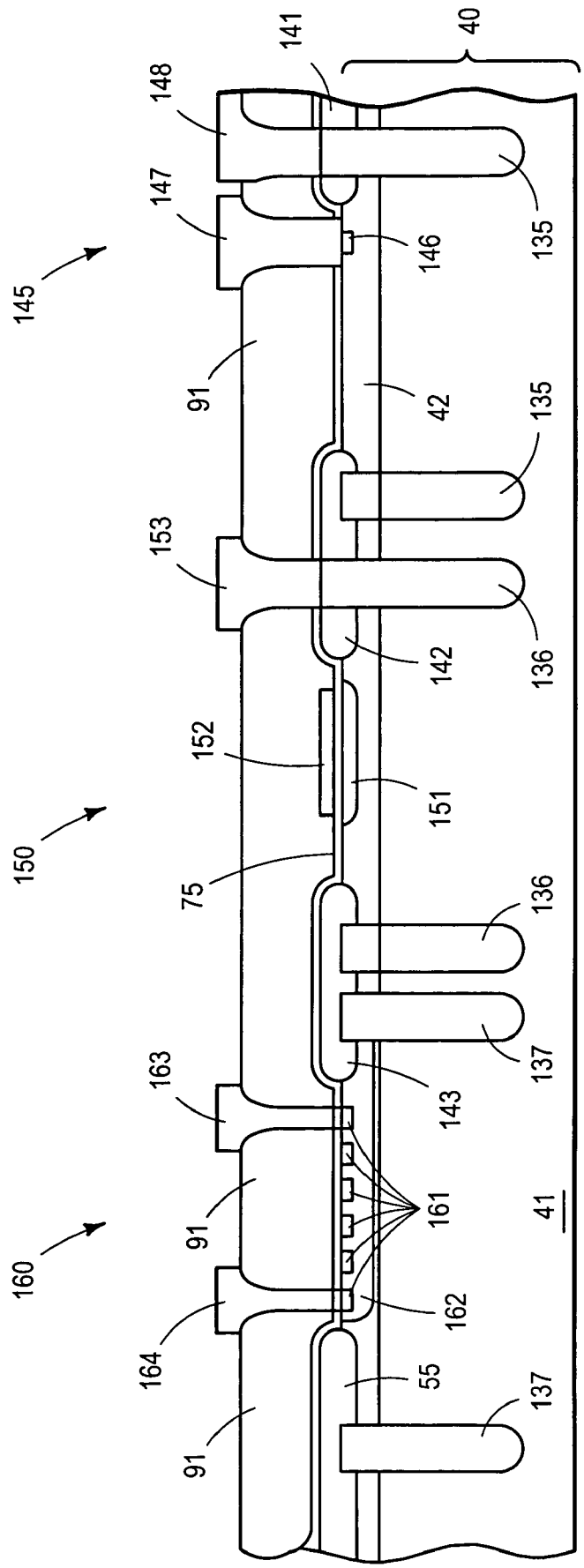

FIG. 17 schematically illustrates embodiments of portions of passive devices that are formed on substrate 40 as a part of device 25. Device 25 includes a diode 145, a capacitor 150, and a resistor 160 that are isolated from each other and from transistors 26, 27, and 28 by isolation trenches that are similar to trenches 34 and 35. The passive devices are illustrated in a portion of substrate 40 adjacent to transistor 28, however, any of the passive devices may be formed in other regions of substrate 40 including within an isolation region that includes one of transistors 26, 27, or 28.

Diode 145 is formed in a portion of substrate 40 that is isolated from the portion of substrate 40 where transistors 26, 27, and 28 are formed as well as the portion of substrate 40 in which capacitor 150 and resistor 160 are formed. An isolation trench 135 surrounds the portion of substrate 40 in which diode 145 is formed. Trench 135 is formed in a manner similar to trenches 34 and 35. However, a conductor 148 is formed through dielectric layer 91 and layer 75 to contact a top surface of a portion of trench 135 in order to form electrical contact thereto. Diode 145 includes a doped region 146 that is formed on a portion of the surface of substrate 40 that is surrounded by trench 135. Preferably, region 146 is formed on the surface of epitaxial layer 42 that is within the region surrounded by trench 135. Region 146 is doped with a doping type that is opposite to the doping type of the region in which it is formed. Preferably, region 146 is doped P-type and forms a cathode of diode 145 and adjacent portions of layer 42 form the anode of diode 145. A conductor 147 is formed through dielectric layer 91 and layer 75 to form electrical contact to region 146. Trench 135 provides electrical contact between conductor 148 and the portion of substrate 40 in which region 146 is formed. In the preferred embodiment, trench 135 and layer 42 are the same conductivity type, thus, trench 135 provides electrical conduction between conductor 148 and the cathode of diode 145. The illustrated embodiment is only one example of how diode 145 may be formed, diode 145 may have various other embodiments within the region that is formed by trench 135.

Similarly, an isolation trench 136 surrounds a portion of substrate 40 in which capacitor 150 is formed in order to isolate capacitor 150 from transistors 26, 27, and 28 in addition to diode 145 and resistor 160. Trench 136 is formed in a manner similar to trenches 34, 35, and 135. Capacitor 150 has a bottom plate that can be formed as a doped region 151 on a surface of substrate 40, and preferably on a surface of layer 42. A top plate of capacitor 150 may be a conductor 152 that is formed on a portion of layer 75 that is overlying region 151. A conductor 153 is formed through an opening in layer 91 to provide electrical contact to a portion of trench 136. Since trench 136 electrically contacts layer 42, trench 136 provides an electrical connection between conductor 153 and the bottom plate formed by region 151. Conductor 152 typically extends along the surface of substrate 40 to form electrical contact to other portions of device 25. The portion of layer 75 between conductor 152 and region 151 forms the dielectric of capacitor 150. The exemplary embodiment illustrated in FIG. 17 is just one example of an embodiment for capacitor 150. Capacitor 150 may have various embodiments within the isolated region formed by trench 136.

In a similar manner, isolation trench 137 surrounds a portion of substrate 40 in which resistor 160 is formed in order to isolate resistor 160 from transistors 26, 27, and 28 in addition to capacitor 150 and diode 145. A doped region 162 is formed in substrate 40 that has an opposite conductivity to the portion of substrate 40 in which resistor 160 is formed. Such regions are often called wells. A doped region 161 is formed within region 162 in order to form the resistive portion of resistor 160. Typically, region 161 is formed as a serpentine pattern extending across the portion of the surface of substrate 40 in which resistor 160 is formed. A resistor conductor 163 forms electrical contact to one end of doped region 161 to form one terminal of resistor 160 and a conductor 164 forms electrical contact to a second end of region 161 in order to form the other terminal of resistor 161. The illustrated embodiment is only one example embodiment for resistor 160.

Typically, trenches 135, 136, and 137 are formed through field oxides 141, 142 and 143 that are similar to field oxides 51-55. Such an embodiment minimizes the spaced used by trenches 135, 136, and 137. Trenches 34, 35, 135, 136, and 137 may be formed in other portions of substrate 40. For example, any of trenches 34, 35, 135, 136, and 137 may be formed through layer 42 and into substrate 41 at other positions within substrate 40.

As can be seen from the electrical connections to the passive elements, trenches 135, 136, and 137 not only provide electrical isolation from electrical conduction through substrate 41 but also provide electrical access to electrical elements of device 25 that are formed in substrate 40. The isolation trenches may provide additional access to other elements of device 25 that have the same doping type as the isolation trench such as to buried layers of active devices.

Referring back to trenches 34, 35, 135, 136, and 137 in general, since width 64 is determined by the minimum line resolution of the equipment used to form device 25, trenches 34, 35, 135, 136, and 137 can be scaled as new equipment with smaller line resolution becomes available. Without trenches 34 and 35, the latch-up rules for devices without trenches 34 and 35 do not scale so the spacings between transistors 27 and 28 do not scale directly with the smaller equipment capabilities, thus, portions of the device have to be re-designed and not just scaled. However, trenches 34, 35, 135, 136, and 137 scale with the equipment resolution thereby facilitating scaling device 25 with the equipment capabilities. Thus, trenches 34, 35, 135, 136, and 137 provide process flexibility and lower manufacturing costs. Further, distance 63 allows changing the thickness of layer 42 without changing the low resistance substrate contacts provided by trenches 34 and 35. Additionally, trenches 34, 35, 135, 136, and 137 typically extend deeper into substrate 41 than can be formed by implanting and subsequent activation of dopants and deeper than can be formed by diffusion of dopants.

Additionally, trenches 34, 35, 135, 136, and 137 collect carriers that may try to flow through substrate 40 between the transistors and other elements of device 25, such as transistors 26, 27, and 28, diode 145, capacitor 150, and resistor 160 and reduce noise coupling both between the transistors and between any other active or passive elements of device 25. Since trenches 34 and 35 surround the periphery of respective transistors 26 and 28, trenches 34 and 35 further block the flow of carriers between transistors thereby reducing noise coupling between the transistors. Extending trenches 34, 35, 135, 136, and 137 through layer 42 into substrate 41 facilitates making electrical contact to trenches 34, 35, 135, 136, and 137 through substrate 41. Typically, substrate 41 is connected to the lowest potential of the system in which device 25 is used. In such a case, substrate 41 provides electrical contact to trenches 34, 35, 135, 136, and 137 to bias the P-N junctions formed by trenches 34, 35, 135, 136, and 137. Such a bias improves the potential well and the carrier collecting capabilities of trenches 34, 35, 135, 136, and 137. In other embodiments, trenches 34, 35, 135, 136, and 137 may have an electrical connection formed for the top, such as by omitting a portion of the insulator overlying the trench, or from the side, such as by a region that extends through layer 42 to contact the trenches form the side. This carrier blocking is especially important when digital circuits are on the same semiconductor device with analog circuits. In such cases, isolation trenches such as trenches 34 and 35 improve the accuracy of the analog circuits while permitting the digital circuits to operate at high frequencies. Since width 64 of trenches is very small as described hereinbefore, trenches 34 and 35 consume no extra area and do not negatively affect the integration density of integrated semiconductor devices.

Once the field oxides are formed, such as field oxides 51, 52, 53, 54, 55, 141, 142, and 143 all steps and operations in the method are performed at temperatures no greater than about eight hundred degrees Celsius (800° C.) until the step of activating the dopants in both the bipolar and MOS transistors as described in the description of FIG. 12. Using only one dopant activation operation improves the performance of the active and passive elements of device 25. Further, since the doping material of trenches 34, 35, 135, 136, and 137 does not have to be annealed, trenches 34, 35, 135, 136, and 137 can be formed at any time during the method of forming device 25 including after field oxide regions are formed and can even be formed through field oxide regions thereby increasing the density of device 25. For a typical prior art device, diffused isolation regions had to be formed prior to forming field oxide regions because the high temperatures and long diffusion times required to diffuse the dopants adversely affected the field oxide regions and the dopants of active areas of transistors and other active devices. Consequently, the performance of the active elements was detrimentally affected.

While the invention is described with specific preferred embodiments, it is evident that many alternatives and variations will be apparent to those skilled in the semiconductor arts. Also, any of layers 43 or 44 may be used with or without layer 42, and layers 43 and 44 may have the same or opposite conductivity to each other. In some embodiments, layer 42 may have the same doping type as substrate 41 or layer 42 may not be present at all. In one such embodiment, substrate 41 may be lightly doped P-type material and layer 42 may be medium doped P-type material. A portion of layer 42 may be counter doped as N-type by methods such as high energy implantation, for example Mev implants, to form a portion of the P-type layer 42 into a N-type region that has a peak doping profile that is no less than the doping described herein for N-type layer 42. The remainder of the devices would be as described herein such as for device 25. In another similar embodiment, layer 42 may be omitted from substrate 41 and a portion of substrate 41 doped, such as with Mev implantation, to form the buried layers described herein and for forming a N-type region on the surface of substrate 41 that has a peak doping profile that is no less than the doping described herein for N-type layer 42. The remainder of the devices would be as described herein such as for device 25. Additionally, the invention has been described for a particular NPN, N-channel, and P-channel transistor structures, although the method is directly applicable to other bipolar transistors, as well as to other MOS transistors, metal semiconductor FETs (MESFETs), HFETs, and other transistor structures.

The invention claimed is:

1. A method of forming a semiconductor device comprising:
    providing a substrate of a first semiconductor material of a first conductivity type;
    forming a first region of a second conductivity type on a surface of the substrate;
    forming a first opening extending from a surface of the first region a first distance into the substrate and surrounding a first portion of the first region;
    forming a second semiconductor material of the first conductivity type within the first opening to form a first isolation trench wherein the second semiconductor material has a substantially constant doping concentration through a depth of the first isolation trench and wherein a portion of the second semiconductor material forms a P-N junction with a portion of the first region;
    forming a first electrical device on the first portion of the first region; and
    forming a second electrical device on a second portion of the first region that is external to the first portion of the first region.

2. The method of claim 1 wherein forming the first electrical device includes forming a device that is one of a MOS transistor, a bipolar transistor, a diode, a capacitor, or a resistor.

3. The method of claim 1 wherein forming the second electrical device includes forming a device that is one of a MOS transistor, a bipolar transistor, a diode, a capacitor, or a resistor.

4. The method of claim 1 wherein forming the second semiconductor material of the first conductivity type includes forming doped polysilicon within the first opening wherein a portion of the doped polysilicon forms the P-N junction with the first region.

5. The method of claim 4 wherein forming the first opening extending from the surface of the substrate the first distance into the first region includes forming the first opening having a width that is no greater than approximately 1.5 microns and a depth that is at least approximately three times the width.

6. The method of claim 1 wherein providing the substrate of the first semiconductor material of the first conductivity type includes providing a bulk semiconductor substrate of the first conductivity type, forming a first buried layer region of the second conductivity type on a surface of the bulk semiconductor substrate and underlying the first portion of the first region, and forming an epitaxial layer of the second conductivity type overlying the first buried layer region.

7. The method of claim 1 wherein forming the second semiconductor material of the first conductivity type includes forming a field isolation region on a surface of the substrate, forming the first opening through The field isolation region and into The substrate, and forming the second semiconductor material within the first opening.

8. The method of claim 1 further including surrounding a third portion of the first region with a second isolation trench filled with the second semiconductor material of the first conductivity type including forming the third portion external to the first portion of the first region and forming at least a portion of a bipolar transistor on the third portion of the first region and forming at least a portion of a first MOS transistor as the first electrical device.

9. The method of claim 8 further including forming a buried layer region of the second conductivity type on a surface of the substrate and underlying the third portion of the first region and forming an epitaxial layer on the surface of the substrate covering the buried layer region.

10. The method of claim 8 wherein forming the portion of the bipolar transistor in the third portion of the first region includes forming the portion of the bipolar transistor at temperatures below an activation temperature of dopants used to form the portion of the bipolar transistor and subsequently activating the dopants used to form the portion of the bipolar transistor and activating dopants used to form the first MOS transistor that is formed in the first region.

11. The method of claim 8 wherein forming the portion of the bipolar transistor on the third portion of the first region includes forming a protective layer on the substrate overlying an active region of the portion of the bipolar transistor and an active region of the first MOS transistor subsequent to forming the active region of the first MOS transistor, forming the first opening through the protective layer and exposing a portion of the first region wherein the first opening overlies the portion of the bipolar transistor and leaving the protective layer overlying the active region of the first MOS transistor.

12. The method of claim 8 wherein surrounding the third portion of the first region with the second isolation trench filled with the second semiconductor material includes forming a second opening extending from the surface of the first region a distance into the substrate and forming doped polysilicon within the opening wherein a portion of the doped polysilicon forms another P-N junction with the first region.

13. The method of claim 1 wherein forming the second semiconductor material of the first conductivity type includes forming the second semiconductor material having a substantially doping concentration of no less than about 1E18 to 1E21 atoms/cm$^3$.

14. A method of forming a semiconductor device comprising:
    providing a substrate of a first semiconductor material of a first conductivity type;

forming a first region of a second conductivity type that is opposite to the first conductivity type on a surface of the substrate;

surrounding a first portion of the first region with a first isolation trench filled with a second semiconductor material of the first conductivity type including forming the trench extending through a portion of a field isolation region and extending a first distance into the substrate wherein at least a portion of the second semiconductor material forms a P-N junction with a portion of the first region;

forming at least a portion of a first bipolar transistor in the first portion of the first region;

forming at least a portion of a first MOP transistor in a second portion of the first region that is external to the first portion of the first region;

forming a protective layer on the first region overlying an active region of the portion of the first bipolar transistor and an active region of the first MOP transistor subsequent to forming the active region of the first MOS transistor; and forming a first opening through the protective layer and exposing a portion of the first region wherein the first opening overlies the portion of the first bipolar transistor and leaving the protective layer overlying an active region of the first MOS transistor.

15. The method of claim 14 wherein surrounding the first portion of the first region with the first isolation trench filled with the second semiconductor material of the first conductivity type includes forming the second semiconductor material having a substantially constant doping concentration of about 1E18 to 1E21 atoms/cm$^3$.

16. The method of claim 14 wherein forming at least the portion of the first MOS transistor in the second portion of the first region includes surrounding the second portion of the first region with a second isolation trench filled with the second semiconductor material and further includes forming at least a portion of a second MOS transistor in a third portion of the first region that is external to both the first portion of the first region and the second portion of the first region.

17. A method of forming a semiconductor device comprising:

providing a substrate of a first semiconductor material of a first conductivity type;

forming a field isolation region on a surface of a first portion of the substrate;

surrounding the first portion of the substrate with a first isolation trench filled with a second semiconductor material of a second conductivity type that is opposite to the first conductivity type including forming an opening through the field isolation region and forming the trench within a portion of the opening and extending through a portion of the field isolation region and extending a first distance into the substrate wherein at least a portion of the second semiconductor material forms a P-N junction with a portion of the substrate;

forming at least a portion of a first MOS transistor in the first portion of the substrate; and forming a first electrical device in a second portion of the substrate that is external to the first portion of the substrate.

18. The method of claim 17 wherein forming at least a portion of a first electrical device includes forming the first electrical device that is one of a MOS transistor, a bipolar transistor, a diode, a capacitor, or a resistor.

19. The method of claim 17 wherein providing the substrate includes providing a bulk semiconductor substrate, forming a first buried layer region of the first conductivity type on a surface of the bulk semiconductor substrate and within the first portion of the substrate, and forming an epitaxial layer overlying the first buried layer region and within the first portion of the substrate.

20. The method of claim 19 further including surrounding a third portion of the substrate with a second isolation trench filled with the second semiconductor material of the second conductivity type including forming the second isolation trench extending the first distance into the substrate wherein at least a portion of the second semiconductor material forms a P-N junction with a portion of the substrate.

21. The method of claim 20 further including forming a bipolar transistor in the third portion of the substrate.

22. The method of claim 17 wherein surrounding the first portion of the substrate with the first isolation trench filled with the second semiconductor material of the second conductivity type that is opposite to the first conductivity type includes forming doped polysilicon within the opening.

23. The method of claim 17 further including forming a plurality of MOS transistors in the first portion of the substrate.

24. A method of forming a semiconductor device comprising:

providing a semiconductor substrate of a first conductivity type;

forming a first region of a second conductivity type that is opposite to the first conductivity type on a surface of the semiconductor substrate; etching an opening in the first region and the semiconductor substrate; and forming an isolation trench by filling the opening with a semiconductor material of the first conductivity type wherein the semiconductor material within the isolation trench forms a P-N junction with the first region for isolating a first electrical device from current flow through the first region to a second electrical device.

25. The method of claim 24 wherein forming the isolation trench includes surrounding a first portion of the first region with a first isolation trench filled with the semiconductor material of the first conductivity type and forming the first electrical device on the first portion of the first region.

26. The method of claim 25 further including forming the second electrical device on a second portion of the semiconductor substrate that is external to the first portion of the first region.

27. The method of claim 24 wherein forming the isolation trench having semiconductor material of the first conductivity type within the isolation trench for isolating the first electrical device from current flow includes forming the first electrical device as one of an MOS device, a bipolar device, a diode, a capacitor, or a resistor.

* * * * *

UNITED STATES PATENT AND TRADEMARK OFFICE
CERTIFICATE OF CORRECTION

PATENT NO. : 7,638,385 B2
APPLICATION NO. : 11/119106
DATED : December 29, 2009
INVENTOR(S) : Grivna et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1008 days.

Signed and Sealed this

Ninth Day of November, 2010

David J. Kappos
*Director of the United States Patent and Trademark Office*